United States Patent
Barzegar et al.

(10) Patent No.: US 11,222,149 B2
(45) Date of Patent: Jan. 11, 2022

(54) ARTIFICIAL THERMAL BATH

(71) Applicant: Google LLC, Mountain View, CA (US)

(72) Inventors: Alireza Shabani Barzegar, Los Angeles, CA (US); Hartmut Neven, Malibu, CA (US)

(73) Assignee: Google LLC, Mountain View, CA (US)

( * ) Notice: Subject to any disclaimer, the term of this patent is extended or adjusted under 35 U.S.C. 154(b) by 702 days.

(21) Appl. No.: 15/771,109

(22) PCT Filed: Oct. 29, 2015

(86) PCT No.: PCT/US2015/058050
§ 371 (c)(1),
(2) Date: Apr. 26, 2018

(87) PCT Pub. No.: WO2017/074386
PCT Pub. Date: May 4, 2017

(65) Prior Publication Data
US 2018/0336299 A1  Nov. 22, 2018

(51) Int. Cl.
*G06F 30/20* (2020.01)
*G06N 10/00* (2019.01)

(52) U.S. Cl.
CPC ............. *G06F 30/20* (2020.01); *G06N 10/00* (2019.01)

(58) Field of Classification Search
CPC .......... G06F 30/20; G06N 10/00; G02B 6/10; H01L 39/233
See application file for complete search history.

(56) References Cited

U.S. PATENT DOCUMENTS

| 2002/0121636 A1* | 9/2002 | Amin | H01L 39/223 257/9 |
| 2005/0185686 A1* | 8/2005 | Rupasov | G02B 6/10 372/43.01 |

(Continued)

FOREIGN PATENT DOCUMENTS

| CN | 101375302 B | * 3/2012 | G06N 10/00 |
| CN | 103582949 A | * 2/2014 | G06N 10/00 |

OTHER PUBLICATIONS

Aron et al. "Steady-state entanglement of spatially separated quibits via quantum bath engineering," Physical Review A, vol. 90, Dec. 1, 2014, 5 pages.

(Continued)

*Primary Examiner* — Kandasamy Thangavelu
(74) *Attorney, Agent, or Firm* — Fish & Richardson P.C.

(57) ABSTRACT

Methods, systems, and apparatus for designing an artificial quantum thermal bath. In one aspect, an apparatus includes a primary quantum system; an auxiliary quantum system comprising a plurality of modes and that interacts with the primary quantum system, wherein: the auxiliary system interacts with the primary quantum system through one or more couplings, wherein the one or more couplings are controllable; a steady state of the auxiliary system, a response function of the auxiliary quantum system, an auxiliary system operator, and a spectrum of the auxiliary quantum system are determined to meet a respective condition; and the auxiliary system is controllable to relax the primary quantum system to an equilibrium state using a controllable function of the auxiliary system operator.

25 Claims, 5 Drawing Sheets

(56) References Cited

U.S. PATENT DOCUMENTS

| | | | | |
|---|---|---|---|---|
| 2008/0033672 A1* | 2/2008 | Gulati | .................. | G06N 10/00 702/69 |
| 2012/0124432 A1* | 5/2012 | Ki | ..................... | G06N 10/00 714/709 |

OTHER PUBLICATIONS

Brask et al. "Autonomous quantum thermal machine for generating steady-state entanglement," arXiv 1504.00187v2, Apr. 15, 2015, 8 pages.
Burgarth et al. "Ergodic and mixing quantum channels in finite dimensions," New Journal of Physics 15(7), 073045, Jul. 24, 2013, 34 pages.
Egger et al. "Multimode Circuit QED with hybrid metamaterial transmission lines," ar XIV 1302,5553v2, Nov. 7, 2013, 5 pages.
Feynman. "Simulating physics with computers", International Journal of Theoretical Physics, 21, Jun. 1982, 22 pages.
Fischbach et al. "Steady-state entanglement enhanced by a dissipative ancilla," arXiv 1510.08247v1, Oct. 28, 2015, 8 pages.
International Preliminary Report on Patentability issued in International Application No. PCT/US2015/058050, dated May 11, 2018, 9 pages.
International Search Report and Written Opinion issued in International Application No. PCT/US2015/058050, dated Aug. 2, 2016, 13 pages.
Ma et al. "Dissipative production of controllable steady-state entanglement of two superconducting quibits in separated resonators," Europhysics letters, vol. 110(4), Jun. 3, 2015, 6 pages.
Novotny et al. "Random Unitary Dynamics of Quantum Networks," Journal of Physics A: Mathematical and Theoretical 42.28, 282003, Jun. 2009, arXiv 0904.0107v1, Apr. 1, 2009, 4 pages.
Poulin et al. "Sampling from the Thermal Quantum Gibbs State and Evaluating Partition Functions with a Quantum Computer," Phys Rev Lett. 103 220502, Nov. 2009, arXiv0905.2199v2, Nov. 30, 2009, 7 pages.
Shabani et al. "Artificial Quantum Thermal Bath," arXiv 1510. 04354v1, Oct. 15, 2015, 7 pages.
Shabani et al. "Continuous Measurement of a non-markovian open quantum system," Physical Review Letters, 112,11, Mar. 19, 2014, arXiv 1307.2101v2, Apr. 26, 2014, 14 pages.
Temme et al. "Quantum Metropolis Sampling," arXiv 0911.3635v2, Oct. 4, 2010, 32 pages.
Terhal et al. "Problem of equilibration and the computation of correlation functions on a quantum computer," Phys Rev. A 61, 022301, Jan. 4, 2002, arXiv quant-ph/9810063v3, May 4, 1999, 35 pages.
Troyer et al. "Computational Complexity and Fundamental Limitation to Fermionic Quantum Monte Carlo Simulations," Phys Rev. Lett. 94, 170201, May 4, 2005, arXiv Cond-mat/0408370v1, Aug. 16, 2004, 5 pages.
Venuti et al. "Adiabaticity in open quantum systems," arXiv 1508. 05558v1, Aug. 23, 2015, 11 pages.
Yung et al. "A quantum-quantum Metropolis algorithm," National Academy of Science, USA, 109.3, Jan. 2012, 6 pages.
Authorized officer Nicolas Douarche, International Search Report and Written Opinion in PCT/US2015/058050 dated Aug. 2, 2016, 13 pages.
A. Shabani, H. Neven: "Artificial quantum thermal bath", Oct. 15, 2015 (Oct. 15, 2015), Retrieved from the Internet: URL: http://arxi v.org/abs/1510 04354vl, [retrieved on Oct. 16, 2015] the whole document.
J. Fischbach, M. Freyberger: "Steady-state entanglement enhanced by a dissipative ancilla", Oct. 28, 2015 (Oct. 28, 2015), Retrieved from the Internet: URL:http://arxiv.org/abs/1510.08247vl, [retrieved on Oct. 29, 2015] figure 1; sections I and II.
S.-L. Ma et al: "Dissipative production 1-25 of controllable steady-state entanglement of two superconducting qubits in separated resonators", Europhysics Letters, v o l. 110, No. 4, 40004, Jun. 3, 2015 (Jun. 3, 2015), figures 1 and 2.
J. Bohr Brask et a l: "Autonomous quantum 1-25 thermal machine for generating steady-state entanglement". Apr. 15, 2015 (Apr. 15, 2015), Retrieved from the Internet: URL:https://arxiv.org/abs/15O4. 0O187v2, [retrieved on Apr. 16, 2015] figure 1; sections I -I I I and Appendix A.
C. Aron et al: "Steady-state entanglement 1-25 of spatially separated qubits via quantum bath engineering". Physical Review A, v o l. 90, 062305, Dec. 1, 2014 (Dec. 1, 2014), the whole document.
L. Campos Venuti et a l: "Adiabaticity in 1-25 open quantum systems". Aug. 23, 2015 (Aug. 23, 2015), Retrieved from the Internet: URL:http://arxi v.org/abs/1508.05558vl, [retrieved on Jul. 15, 2016] the whole document.
Balescu, "Equilibrium and nonequilibrium statistical mechanics" John Wiley Sons, 1975, 756 pages.
Ballentine, "Quantum Mechanics A Modem Development" World Scientific Publishing Co. Pte. Ltd., 1998, 673 pages.
Baxter, "Exactly solved models in statistical mechanics" Academic Press, 1982, 502 pages.
Breuer et al, "The Theory of Open Quantum Systems" Oxford University Press, 2007, 645 pages.
Feynman et al, "The Feynman Lectures on Physics" Addison-Wesley Publishing Company, 1963, 515 pages.
Huang, "Qubit-resonator system as an application to quantum computation" Thesis for the degree of Doctor of Philosophy, 2004, 73 pages.
Jerger, "Experiments on superconducting qubits coupled to resonators" Thesis for the degree of Doctor of Philosophy, Karlsruher Institut fur Technologic, 2013, 140 pages.
Reinisch et. al Leaky Modes in Nonlinear Optical Resonators, NATO Science Series, 2020, 7 pages (English abstract only).
Pich, "Effective Field Theory" arXiv, 1998, 106 pages.
Pierre et al, "Storage and on-demand release of microwaves using superconducting resonators with tunable coupling" arXiv, 2014, 5 pages.
Reed et al, "Methods of Modern Mathematical Physics I: Functional Analysis" Academic Press, Inc,, 1980, 413 pages.
Rollins, "Delta Functions" University of Berkeley, 2006, 4 pages.
Wilming, "Thermalization and equilibration in quantum many-body systems: Insights from free models" Thesis for the degree of Bachelor, 2011, 33 pages.
Coldren et al., "Diode lasers and photonic integrated circuits" Wiley-Interscience Publication, 10 pages.

* cited by examiner

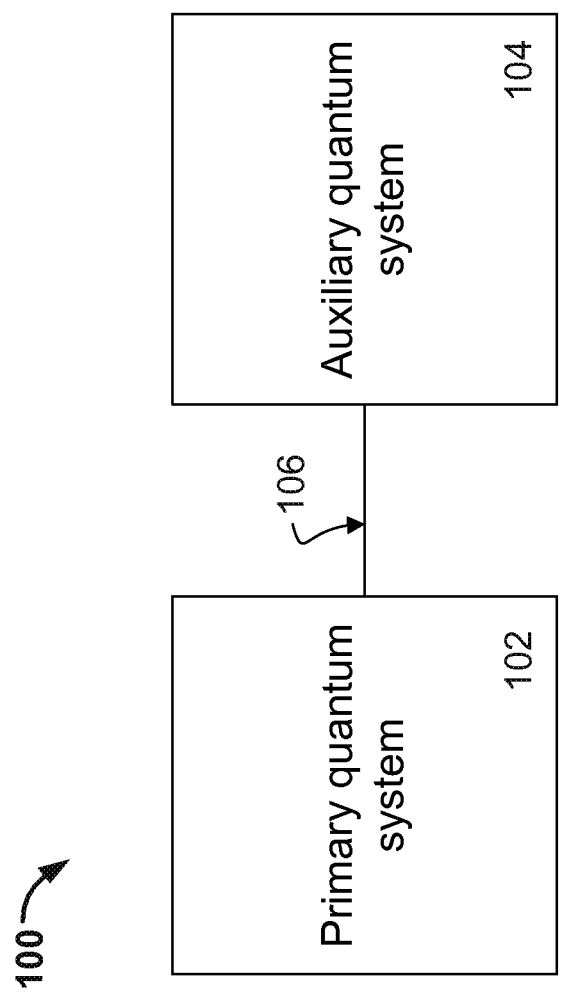

ARTIFICIAL THERMAL BATH

BACKGROUND

Computing equilibrium properties of many-particle systems is a major goal of quantum simulation. Quantum simulation algorithms such as the Quantum Metropolis algorithm require a universal gate-model quantum computer to compute equilibrium properties corresponding to an arbitrary Hamiltonian.

Optimization is a core computational task in artificial intelligence. In an annealing method of optimization, an optimal solution to a computational task is encoded in a lowest energy configuration of a physical system, which is achieved by thermal (classical) annealing, e.g., cooling down the system approaching zero temperature, or quantum annealing, e.g., tunneling through energy barriers, or hybrid thermal-quantum annealing, e.g., cooling down to zero temperature whilst tunneling through barriers. Physical realizations of hybrid quantum-classical annealing processes require varying the temperature of a physical system. For technologies including quantum devices in refrigerated environments, changing the fridge temperature is not a viable approach since raising the fridge temperature excites all types of fluctuations and unwanted defects amplifying noise.

SUMMARY

This specification relates to quantum hardware that can be used to perform quantum simulation and hybrid quantum-classical annealing tasks. In particular, this specification describes technologies relating to controlling quantum noise to implement an artificial thermal bath for a quantum system such that the equilibrium state of the quantum system is described by a Gibbs state with tunable temperature. The applications of implementing an artificial thermal bath include quantum simulation, statistical physics calculations and quantum-classical annealing.

In general, one innovative aspect of the subject matter described in this specification can be implemented in an apparatus that includes a primary quantum system, an auxiliary quantum system comprising a plurality of modes and that interacts with the primary quantum system, wherein: the auxiliary system interacts with the primary quantum system through one or more couplings, wherein the one or more couplings are controllable; a steady state of the auxiliary system, a response function of the auxiliary quantum system, an auxiliary system operator, and a spectrum of the auxiliary quantum system determined to meet a respective condition; and the system is controllable to relax the primary quantum system to an equilibrium state using a controllable function of the auxiliary system operator.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the auxiliary system interacts with an environment external to the primary quantum system and the auxiliary quantum system.

In other implementations the dynamics of the auxiliary system are controllable to relax the primary quantum system to an equilibrium state using a controllable function of the auxiliary system operator.

In some implementations the dynamics of the auxiliary quantum system are controlled such that the auxiliary quantum system is an artificial thermal quantum bath for the primary quantum system.

In further implementations the controllable function of the auxiliary system operator is a two-time correlation function of the auxiliary system operator.

In other implementations, the equilibrium state of the primary quantum system is described by a Gibbs state $e^{-\beta H_S}/Z$, where $\beta^{-1}$ represents a tunable temperature, $H_S$ represents a primary quantum system and $Z$ represents a partition function.

In some cases, the spectrum of the auxiliary quantum system is a function of a set of tunable physical parameters of the auxiliary quantum system comprising (i) a frequency and amplitude of a drive signal, and (ii) a leakage rate of resonator modes.

In other cases, the set of physical parameters and the auxiliary system modes are tuned in order to achieve a controllable two-time correlation function.

In some implementations the dynamics of the auxiliary quantum system are controlled such that $$\lim_{t\to\infty}[\gamma_{\alpha\beta}(-\omega, t) = e^{-\beta\omega}\gamma_{\beta\alpha}(\omega, t)]$$

is satisfied within a first accuracy, where t represents time, $\gamma_{\alpha\beta}(-\omega, t)$ represents the response function of the auxiliary quantum system with $\alpha,\beta$ representing eigenvalues of a system-bath interaction Hamiltonian, $\omega$ represents auxiliary quantum system frequency and $\beta^{-1}$ represents a tunable temperature.

In other implementations the dynamics of the auxiliary quantum system are controlled such that $$\gamma_{\alpha\alpha'}(\omega, t) = \delta_{\alpha\alpha'} e^{\frac{\beta}{2}\omega} f(t)$$

for $\omega \in [\omega_{min}, \omega_{max}]$ is satisfied within a second accuracy, where $\gamma_{\alpha\alpha'}(\omega, t)$ represents the response function of the auxiliary quantum system with $\alpha, \alpha'$ representing eigenvalues of a system-bath interaction Hamiltonian, $\delta_{\alpha\alpha'}$ represents a Kronecker delta, $\beta^{-1}$ represents a tunable temperature, $\omega$ represents auxiliary quantum system frequency, $f(t)$ represents a time-dependent real-valued function and $\omega_{min}$, $\omega_{max}$ represent minimum and maximum frequency values.

In some cases the dynamics of the auxiliary quantum system are controlled such that $$\gamma_{\alpha\alpha'}(\omega, t) = \delta_{\alpha\alpha'} e^{\frac{\beta}{2}\omega} f(t)$$

for $\omega \in [\omega_{min}, \omega_{max}]$ is satisfied within a second accuracy according to a set of $\gamma_{\alpha\alpha'}(\omega, t)$, where $\gamma_{\alpha\alpha'}(\omega, t)$ represents the response function of the auxiliary quantum system with $\alpha$, $\alpha'$ representing eigenvalues of a system-bath interaction Hamiltonian, $\delta_{\alpha\alpha'}$ represents a Kronecker delta, $\beta^{-1}$ represents a tunable temperature, $\omega$ represents auxiliary quantum system frequency, $f(t)$ represents a time-dependent real-valued function and $\omega_{min}$, $\omega_{max}$ represent minimum and maximum frequency values.

In some implementations $\omega_{min}$ and $\omega_{max}$ are chosen such that the energy scales of the primary quantum system are included in the interval $[\omega_{min}, \omega_{max}]$.

In other implementations the auxiliary quantum system enables an analog realization of Quantum Metropolis Sampling.

In some cases the auxiliary quantum system serves as a thermal drive for a hybrid quantum-classical annealer.

In some implementations the auxiliary quantum system comprises one or more multi-mode resonators. For example, the auxiliary quantum system may comprise a continuous mode of resonators, also known as microwave metamaterial.

In some cases the primary quantum system comprises one or more qubits that are respectively coupled to a respective multi-mode resonator.

In other cases the primary quantum system comprises one or more qubits that are collectively coupled to a multi-mode resonator.

The subject matter described in this specification can be implemented in particular ways so as to realize one or more of the following advantages, particularly in the areas of quantum simulation and quantum-classical annealing.

Computing the physical and chemical properties of many-particle systems is of fundamental importance for discovering and designing quantum materials, or for calculating molecular properties at finite temperatures. In particular, computing the equilibrium properties of many-particle systems is a major goal for quantum simulation. The statistical properties of quantum systems is essentially encoded in their thermal equilibrium state $e^{-\beta H_S}/Z$. Therefore, a detailed simulation of quantum materials on digital computers is an extremely complex task involving matrix-vector computations of exponentially large sizes. A system implementing an artificial thermal bath enables a dynamical approach for simulating quantum thermalization on an analog quantum computer.

Optimization is a core computational task in artificial intelligence. In an annealing method of optimization, the optimal solution is encoded in the lowest energy configuration of the physical system. This lowest energy can be achieved by slowly cooling down the system approaching zero temperature, e.g., thermal annealing, or via tunneling through energy barriers, e.g., quantum annealing. A hybrid quantum-classical annealer uses both of these dynamical features to solve an optimization problem. Physical realizations of such processes require varying the temperature of the device, invoking the need for generating an effective quantum thermal bath with tunable temperature. A system implementing an artificial thermal bath enables an analog implementation of a quantum metropolis sampling algorithm. In addition, a system implementing an artificial thermal bath avoids the need to physically change the laboratory, e.g. fridge, temperature, avoiding excitation of all types of fluctuations in the quantum device.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 1 depicts an example system for realizing an artificial thermal bath.

Like reference numbers and designations in the various drawings indicate like elements.

DETAILED DESCRIPTION

Figure 2A:
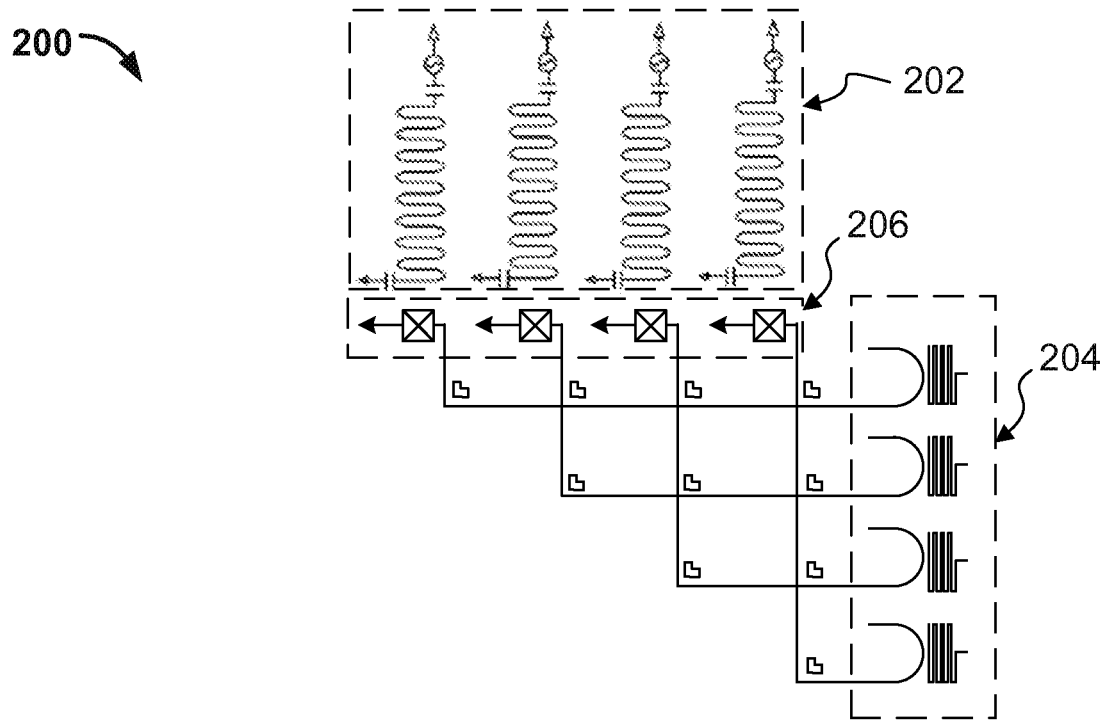
FIG. 2A-2C depict three example different superconducting architectures for realizing an artificial thermal bath.

This specification describes an architecture and method for realizing an artificial quantum thermal bath for a given quantum system S, based on the physics of cavity cooling and driven dissipative quantum systems. The design of the artificial quantum thermal bath is based on engineering the dynamical fluctuations of an auxiliary quantum system B that plays the role of a thermal bath for the quantum system S.

The thermodynamics principle of entropy minimization dictates the Gibbs state as the equilibrium configuration of any physical system. For a quantum system, the Gibbs state is an energy population state with no coherence between energy levels. At equilibrium, the distribution of population is set by the rate of upward and downward transitions between energy levels. These transition rates are determined by the couplings and internal dynamics of the quantum thermal bath. Therefore, controlling an effective temperature for an open quantum system can be achieved by manipulating the dynamics of the coupled quantum bath.

The artificial quantum thermal bath is described below with reference to two applications, namely quantum simulation and quantum-classical annealing.

Example Operating Environment

FIG. 1 depicts an example system 100 for realizing an artificial thermal bath. The system 100 includes a primary quantum system 102, and an auxiliary quantum system 104 that interacts with the primary quantum system 102. In some implementations the auxiliary quantum system 104 may be an open quantum system that interacts with an environment that is external to the primary quantum system 102 and the auxiliary quantum system 104. In other implementations the auxiliary quantum system 104 may be a closed quantum system that does not interact with an external environment. The total system Hamiltonian $H_{SB}$ is given below in equation (1).

$$H_{SB} = H_S + H_B(t) + H_I(t) \qquad (1)$$

In equation (1), $H_{SB}$ represents the total system Hamiltonian, $H_S$ is the primary quantum system Hamiltonian, $H_B(t)$ is the time-dependent auxiliary quantum system Hamiltonian, and $H_I(t)$ is the time-dependent interaction Hamiltonian.

The auxiliary quantum system 104 interacts with the primary quantum system 102 through one or more couplings 106. Examples of such couplings are described below with reference to FIGS. 2A-2C. In some implementations the auxiliary quantum system 104 is weakly coupled to the primary quantum system 102. The coupling of the auxiliary quantum system 104 to the primary quantum system 102 enables the auxiliary quantum system to interact with the primary quantum system such that fluctuations of the auxiliary system 104 affect the dynamics of the primary quantum system 102. In some implementations, as shown in FIGS. 2A 2C and FIGS. 3A-3C, the auxiliary quantum system 104 may include one or more multi-mode resonators, and the primary quantum system may include one or more qubits that are either respectively coupled to a respective multi-mode resonator, or collectively coupled to a single multi-mode resonator. In some implementations the auxiliary quantum system may include a continuous mode of resonators (also known as microwave metamaterial).

The one or more couplings 106 are controllable couplings. The controllability of the couplings depends on the particular physical realization of the qubits that are coupled, e.g., two-level atoms, electron spins, or superconducting qubits. For example, in the case of electron spins, the couplings between spin qubits may be controlled via applying external electromagnetic fields, where the external electromagnetic fields in turn are controllable by adjusting the parameters of the machines used to apply the electromagnetic field, such as the wavelength and amplitude of the electromagnetic field. In the case of superconducting qubits, the interaction between the qubits may be controlled through adjusting the current bias, for example by adjusting current bias pulses with controlled amplitude and duration.

In some implementations the primary quantum system is an open quantum system. If the one or more qubits included in the primary quantum system are superconducting qubits, the auxiliary quantum system 104 may include a set of lossy resonators, transmission lines, array of qubits, or metamaterials. In any case, the steady state of the auxiliary quantum system 104 may meet a respective condition, for example the steady state of the auxiliary quantum system 104 may be fully characterized. The role of the steady state of the auxiliary quantum system and its characterization is described in more detail below with reference to FIG. 4.

The auxiliary quantum system 104 is controllable through a set of tunable physical parameters of the auxiliary system. The tunable physical parameters include the auxiliary quantum system density modes, the frequency and amplitude of a drive signal that may be used to drive the resonator, and a rate of leakage of the resonator modes. In some implementations the rate of leakage may be frequency dependent. The spectrum of the auxiliary quantum system is a function of the set of tunable physical parameters, and meets a respective condition, for example the spectrum of the auxiliary quantum system may be fully characterized.

The dynamics of the auxiliary quantum system 104 are controllable such that the primary quantum system 102 relaxes to an equilibrium state. The equilibrium state of the primary quantum system is described by a Gibbs state $e^{-\beta H_S}/Z$ with tunable temperature $\beta^{-1}$ and partition function Z. The dynamics of the auxiliary system are controlled such that the primary quantum system relaxes to the Gibbs state using a two-time correlation function of the auxiliary system operator. In order to achieve a controllable two-time correlation function, the set of physical parameters described above are appropriately tuned. By controlling the dynamics of the auxiliary quantum system in such a way, the auxiliary quantum system becomes an artificial thermal quantum bath for the primary quantum system.

The dynamics of the auxiliary quantum system are controlled in such a way that equation (2) below is satisfied within a first accuracy. For example, the height, peak center and width of a Lorentzian function may be controlled by the amplitude of the drive signal E, leakage rate $\kappa$ and drive frequency $\omega_d$ accordingly. In some implementations the leakage rate may be a frequency dependent leakage rate.

$$\lim_{t \to \infty} [\gamma_{\alpha\alpha'}(-\omega, t) = e^{-\beta\omega}\gamma_{\alpha\alpha'}(\omega, t)] \quad (2)$$

In equation (2), t represents time, $\gamma_{\alpha\alpha'}(-\omega, t)$ is the auxiliary quantum system response function and is a Fourier transform of the auxiliary quantum system fluctuations in time, $\alpha$, $\alpha'$ represent eigenvalues of a system-bath interaction Hamiltonian, $\omega$ represents auxiliary quantum system frequency, $\beta^{-1}$ represents a tunable temperature. Equation (2) provides a sufficient condition for the dynamics of the primary quantum system to relax to a Gibbs state. Equation (2) is derived and discussed below with reference to FIG. 4. The dynamics of the auxiliary quantum system may also be controlled such that equation (3) below is satisfied within a second accuracy.

$$\gamma_{\alpha\alpha'}(\omega, t) = \delta_{\alpha\alpha'} e^{\frac{\beta}{2}\omega} f(t) \text{ for } \omega \in [\omega_{min}, \omega_{max}] \quad (3)$$

In Equation (3), $\delta_{\alpha\alpha'}$ is the Kronecker delta, $\beta^{-1}$ represents a tunable temperature, $\omega$ represents auxiliary quantum system frequency, $f(t)$ is a time-dependent, real-valued function and $\omega_{min}$ and $\omega_{max}$ are chosen such that the primary quantum system energy scales are included in the interval $[\omega_{min}, \omega_{max}]$. Equation (3) provides a sufficient condition for the dynamics of the primary quantum system to relax to a Gibbs state. Equation (3) is derived and discussed below with reference to FIG. 4. In some implementations, the dynamics of the auxiliary quantum system may be controlled such that $$\gamma_{\alpha\alpha'}(\omega, t) = \delta_{\alpha\alpha'} e^{\frac{\beta}{2}\omega} f(t)$$

for $\omega \in [\omega_{min}, \omega_{max}]$ is satisfied within the second accuracy according to a set of auxiliary quantum system response functions $\gamma_{\alpha\alpha'}(\omega,t)$. Conditions for thermalization are described in more detail below with reference to FIG. 4.

Figure 2B:
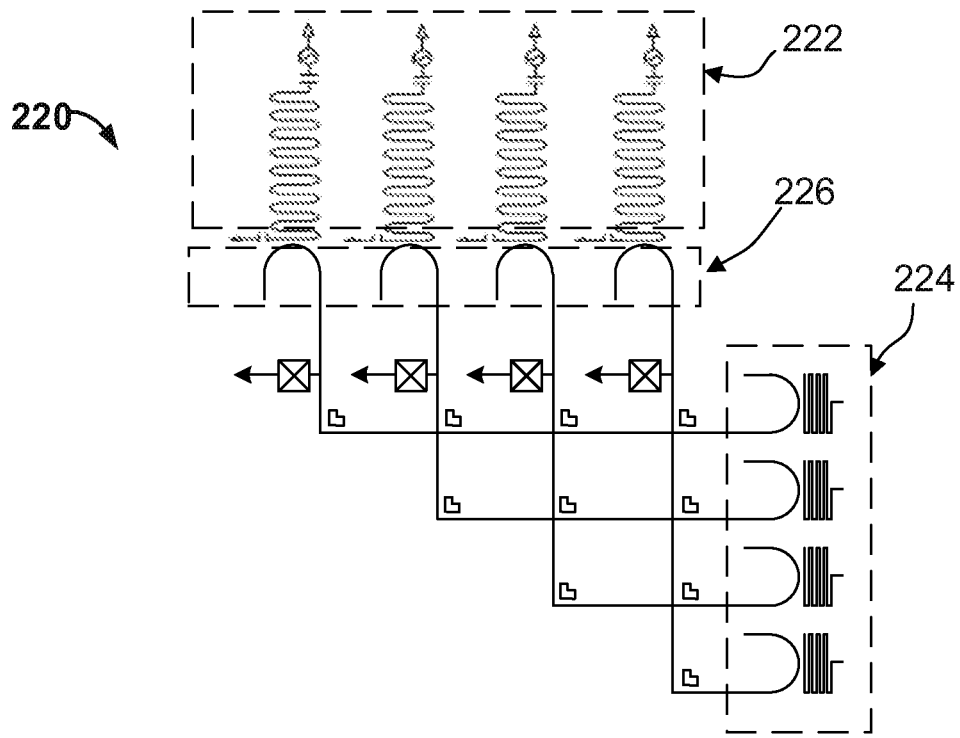
Figure 2C:
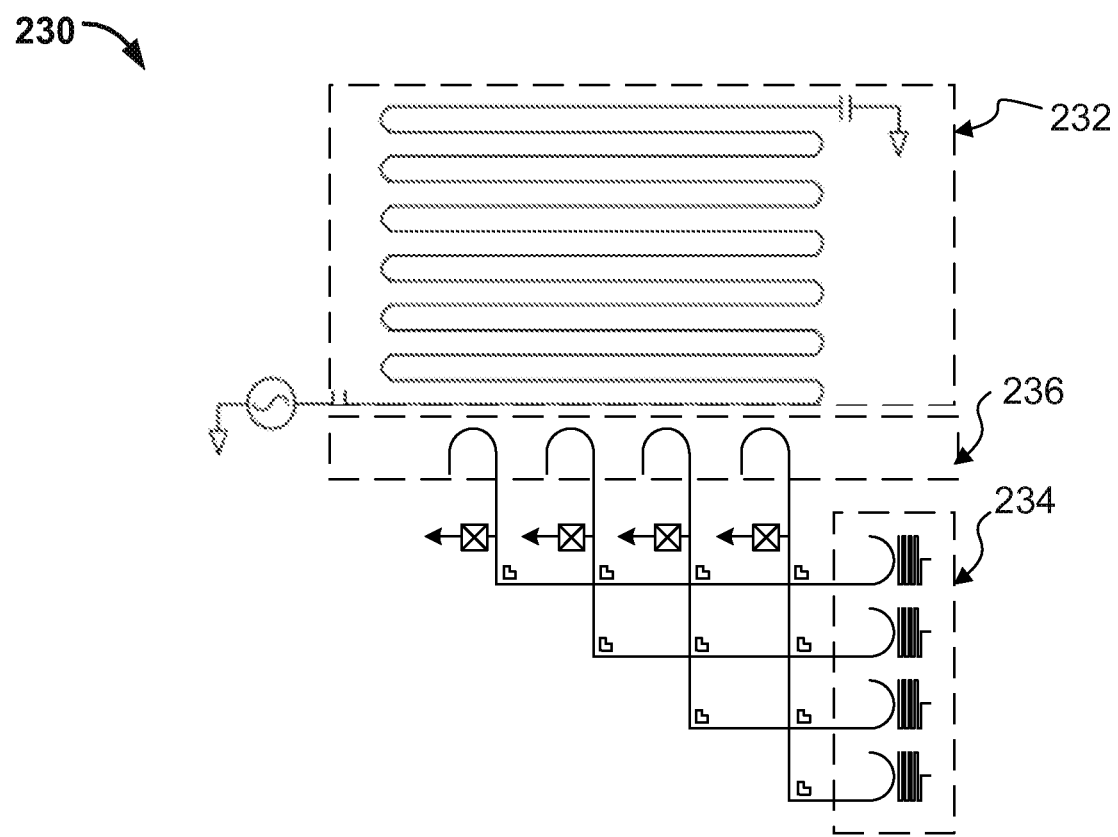

FIGS. 2A 2C depict three different superconducting architectures for realizing an artificial thermal bath system, such as system 100 of FIG. 1 described above.

FIG. 2A depicts a superconducting architecture 200 for realizing an artificial thermal bath system. The architecture 200 includes a set of multi-mode resonators 202 that are locally coupled to a set of qubits, e.g., superconducting qubits, 204 through a $\sigma_x$ coupling 206. FIG. 2A is a design for a hybrid quantum-classical annealer where the qubits are locally coupled to the multi-mode resonators. The Hamiltonian corresponding to the architecture depicted in FIG. 2A is given by equation (4) below.

$$H_{SB} = H_S + \Sigma g_{jk} X_j (a_{jk} + a_{jk}^\dagger) \Sigma_{jk} \omega_{jk} a_{jk}^\dagger a_{jk} \quad (4)$$

In equation (4) $H_{SB}$ represents the total system Hamiltonian, $H_S$ represents a primary quantum system, $g_{jk}$ is an interaction constant, $X_j$ is a Pauli X operator, $a_{jk}$ is an annihilation operator, $a_{jk}^\dagger$ is Hermitian conjugate of an annihilation operator (i.e., a creation operator,) and $\omega_{jk}$ is a resonator frequency.

FIG. 2B depicts a superconducting architecture 220 for realizing an artificial thermal bath system. The architecture 220 includes a set of multi-mode resonators 222 that are locally coupled to a set of qubits, e.g., superconducting qubits, 224 through a $\sigma_z$ coupling 226. FIG. 2B is a design for a hybrid quantum-classical annealer where the qubits are locally coupled to the multi-mode resonators. The Hamiltonian corresponding to the architecture depicted in FIG. 2B is given by equation (5) below.

$$H_{SB}=H_S+\Sigma g_{jk}Z_j(a_{jk}+a_{jk}^\dagger)+\Sigma_{jk}\omega_{jk}a_{jk}^\dagger a_{jk} \qquad (5)$$

In equation (5) $H_{SB}$ represents the total system Hamiltonian, $H_S$ represents a primary quantum system, $g_{jk}$ is an interaction constant, $Z_j$ is a Pauli-Z operator, $a_k$ is an annihilation operator, $a_{jk}^\dagger$ is a creation operator, and $\omega_{jk}$ is a resonator frequency.

FIG. 2C depicts a superconducting architecture 230 for realizing an artificial thermal bath system. The architecture 230 includes a multi-mode resonator 232 that is locally coupled to a set of qubits, e.g., superconducting qubits, 234 through a $\sigma_z$ coupling 236. FIG. 2C is a design for a hybrid quantum-classical annealer where the qubits are collectively coupled to a single multi-mode resonators. The Hamiltonian corresponding to the architecture depicted in FIG. 2C is given by equation (6) below.

$$H_{SB}=H_S+\Sigma g_{jk}Z_j(a_k+a_k^\dagger)+\Sigma_k\omega_k a_k^\dagger a_k \qquad (6)$$

In equation (6) $H_{SB}$ represents the total system Hamiltonian, $H_S$ represents a primary quantum system, $g_{jk}$ is an interaction constant, $Z_j$ is a Pauli-Z operator, $a_k$ is an annihilation operator, $a_k^\dagger$ is a creation operator and $\omega_k$ is a resonator frequency.

Figure 3A:
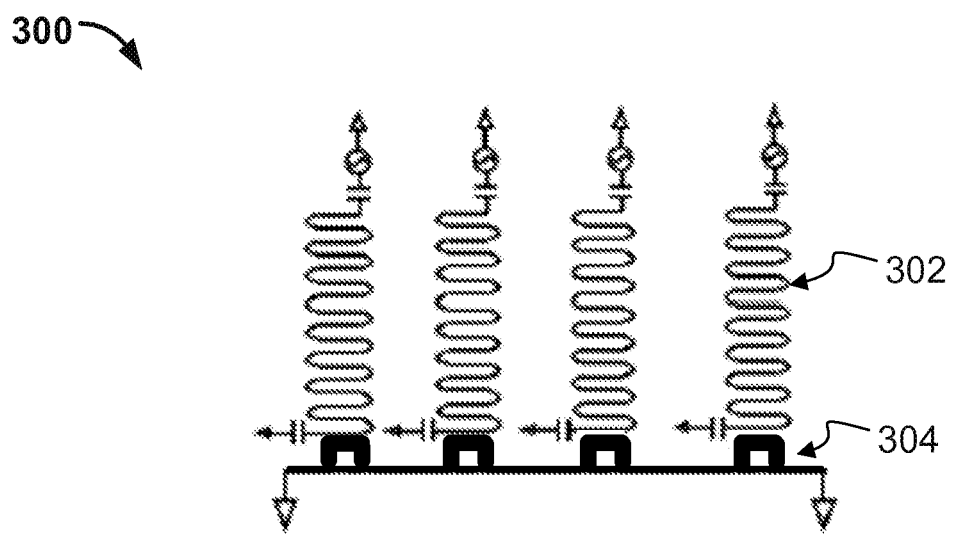
FIGS. 3A-3B depict examples of multi-mode resonators coupled to transmon qubits.
Figure 3B:
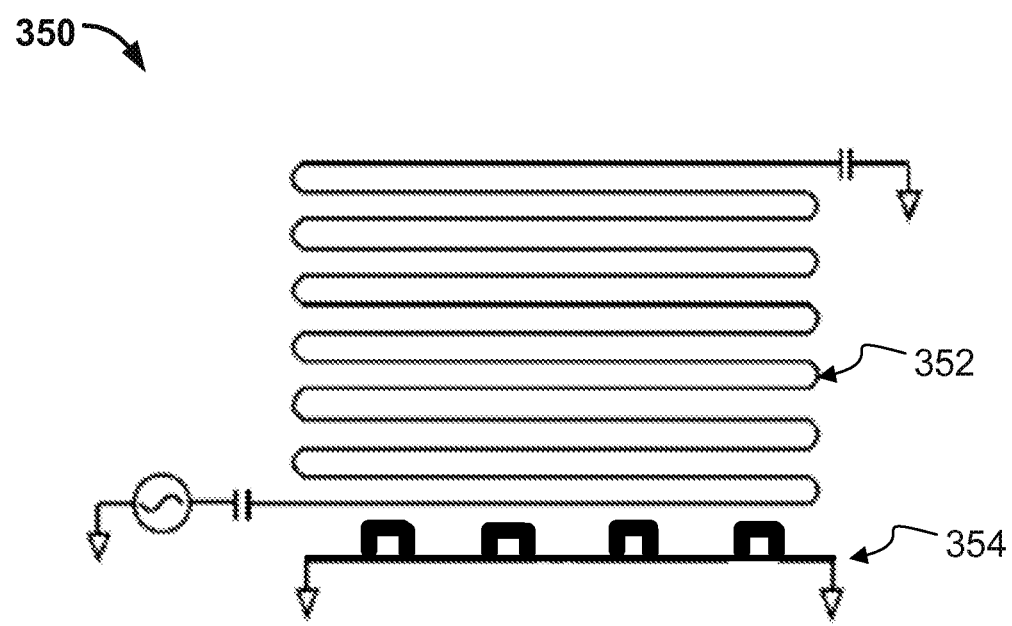

FIGS. 3A and 3B depict multi-mode resonators coupled to transmon qubits that may be used to realize an artificial thermal bath. FIG. 3A depicts a set of transmon qubits, e.g., transmon qubit 304, that are locally coupled to a respective multi-mode resonator, e.g., multi-mode resonator 302. FIG. 3B depicts a set of transmon qubits 354 that are collectively coupled to a single multi-mode resonator 352.

Engineering an Effective Temperature

Microscopic theory of quantum master equations and a Kubo-Martin-Schwinger (KMS) condition guarantee the relaxation of an excited quantum system, such as primary quantum system 102 described above with reference to FIG. 1, to a Gibbs state through the engineering of the dynamical fluctuations of a coupled auxiliary quantum system, such as auxiliary quantum system 104.

Consider a primary quantum system S that is coupled to an auxiliary quantum system B, which is also referred to as a bath. In some implementations the primary quantum system is weakly coupled to the auxiliary quantum system. In some implementations, the system S may include one or more superconducting qubits. In such cases, the system B may include, for example, a set of lossy resonators, transmission lines, array of qubits, or meta-materials. As described above with reference to FIG. 1, the total system-bath Hamiltonian is given by $H_{SB}=H_S+H_B+H_I(t)$, with $H_{SB}$ representing the total system Hamiltonian, $H_S$ representing the primary quantum system, $H_B$ representing the auxiliary quantum system Hamiltonian and $H_I(t)$ a time-dependent interaction Hamiltonian. The dynamics of the system-bath in the interaction picture is described by equation (7) below.

$$\frac{d\rho_{SB}}{dt}=-i[\tilde{H}_I(t),\rho_{SB}(t)] \qquad (7)$$

In equation (7), $\rho_{SB}(t)$ is the density operator of the system-bath and $\tilde{H}_I(t)$ is the interaction Hamiltonian in the interaction picture. A first assumption is that the system dynamics are sufficiently described by a second-order perturbative solution. The second-order perturbative solution of the dynamics of the system-bath yields equation (8) below.

$$\frac{d\rho_{SB}}{dt}=-itr_B[\tilde{H}_I(t),\rho_{SB}(0)]-\int_0^t ds\, tr_B[\tilde{H}_I(t),[\tilde{H}_I(s),\rho_{SB}(s)]] \qquad (8)$$

In equation (8) $\rho_S$ represents the density operator of the system, $tr_B$ represents the trace over the bath, $\tilde{H}_I$ is the interaction Hamiltonian in the interaction picture, and $\rho_{SB}$ represents the density operator of the system-bath.

A second assumption and constraint for the auxiliary quantum system B is an initial state condition, as given below in equation (9).

$$tr_B[\tilde{H}_I(t),\rho_{SB}(0)]=tr(\tilde{B}(t)\rho_B(0))[\tilde{S}(t),\rho_S(0)]=0 \qquad (9)$$

In equation (9) $tr_B$ represents the trace over the bath, $\tilde{H}_I$ is the interaction Hamiltonian in the interaction picture, $\rho_{SB}$ represents the density operator of the system-bath, $\tilde{B}(t)$ represents the bath operator in the interaction picture, $\rho_B$ represents the density operator of the bath, $\tilde{S}(t)$ represents the system operator in the interaction picture, and $\rho_S$ represents the density operator of the system.

The initial state condition given by equation (9) may be guaranteed in at least two ways. For example, for an implementations of the Metropolis algorithm, the initial state of the primary quantum system density operator $\rho_S(0)=I_S$. Preparing such an initial state in a maximally mixed state can be achieved by driving the qubits by white noise.

In another example, where the auxiliary quantum system serves as a thermal drive for a hybrid quantum-classical annealer, the system-bath interaction may be designed such that $tr(\tilde{B}(t)\rho_B(0))=0$. At least one way to guarantee this condition is by shifting the system Hamiltonian as given by equation (10) below.

$$H_{SB}=H_S+\Sigma_\alpha S_\alpha\otimes B_\alpha(t)+H_B=\tilde{H}_S+\Sigma_\alpha S_\alpha\otimes(B_\alpha(t)-\langle B_\alpha(t)\rangle)+H_B \qquad (10)$$

In another example, where the auxiliary quantum system serves as a thermal drive for a hybrid quantum-classical annealer, the system-bath interaction may be designed such that $tr(\tilde{B}(t)\rho_B(0))=0$. At least one way to guarantee this condition is by shifting the primary quantum system Hamiltonian as given by equation (10) below.

$$H_{SB}=H_S+\Sigma_\alpha S_\alpha\otimes B_\alpha(t)+H_B=\tilde{H}_S+\Sigma_\alpha S_\alpha\otimes(B_\alpha(t)-\langle B_\alpha(t)\rangle)+H_B \qquad (10)$$

In equation (10), $H_{SB}$ represents the total system Hamiltonian, $H_S$ represents the primary quantum system, $\alpha$ represents eigenvalues of the system-bath interaction Hamiltonian, $\tilde{H}_S=H_S+\Sigma_\alpha S_\alpha\langle B_\alpha(t)\rangle$ where $S_\alpha$ and $B_\alpha(t)$ are system and bath operators, respectively, that are Hermitian, and $H_B$ represents the bath Hamiltonian. Following shifting the primary quantum system Hamiltonian, the condition $tr(\tilde{B}(t)\rho_B(0))=0$ holds by definition. In the context of annealing, the problem must be encoded in the modified Hamiltonian $H_S+\Sigma_\alpha S_\alpha\langle B_\alpha(t)\rangle$.

Returning to the microscopic theory of quantum master equations, following equation (9), a further Markovian assumption is applied where the auxiliary quantum system B is required to be strongly attracted to an equilibrium state $\rho_B^{SS}$ such that after any perturbative kick, the auxiliary quantum system B quickly relaxes back to its equilibrium state. For example, in some implementations, the auxiliary quantum system B may be a strongly lossy driven resonator which is in a coherent steady-state.

As a result of the Born-Markov assumption, the density operator of the system-bath may be approximated by $\rho_{SB}(t)=\rho_S(t)\otimes\rho_B^{SS}$, which leads to the Redfield equation (11) below.

$$\frac{d\rho_S}{dt} = -\int_0^\infty ds\, tr_B[\tilde{H}_I(t),[\tilde{H}_I(t-s),\rho_S(t)\otimes\rho_B^{SS}]] \quad (11)$$

In Equation (11), $\rho_S$ represents the density operator of the system, $tr_B$ represents the trace over the bath, $\tilde{H}_I$ is the interaction Hamiltonian in the interaction picture and $\rho_B^{SS}$ is the equilibrium state.

The interaction Hamiltonian $H_I(t)$ may take the form $H_I=\Sigma_\alpha S_\alpha \otimes B_\alpha(t)$, where $\alpha$ represents eigenvalues of the system-bath interaction Hamiltonian, $B_\alpha(t)$ is a bath operator for eigenvalue $\alpha$, and the system operators $S_\alpha$ for eigenvalue a may be defined below in equation (12) below.

$$S_\alpha(\omega)=\Sigma_{\epsilon'-\beta=\omega}\Pi(\epsilon)S_\alpha\Pi(\epsilon') \quad (12)$$

In equation (12), $\omega$ represent frequencies, E represent indices related to the frequencies, and $\Pi(\epsilon)$ are unitary operators. Further, making the rotating-wave approximation, the Lindblad equation given below in equation (13) is obtained.

$$\frac{d\rho_S}{dt} = -i[H_{lamb}(t),\rho_S] + D(\rho_S) \quad (13)$$

In equation (13), $\rho_S$ represents the density operator of the system, the system energy Lamb shifts are given by $H_{lamb}(t)=\Sigma_\omega \Sigma_{\alpha,\beta} \eta_{\alpha\beta}(\omega,t) S_\alpha^\dagger(\omega) S_\beta(\omega)$ where $\omega$ represents frequency, $\alpha,\beta$ represent eigenvalues of the system-bath interaction Hamiltonian, $\eta_{\alpha,\beta}(\omega, t)$ are constants, $S_\alpha^\dagger$ is a Hermitian conjugate of the system operator for eigenvalue $\alpha$, $S_\beta$ is the system operator for eigenvalue $\beta$, and the decoherence $D(\rho_S)$ is given by equation (14) below.

$$D((\rho_S)=\Sigma_{\omega,\alpha,\beta}\gamma_{\alpha,\beta}(\omega,t)(S_\beta(\omega)\rho_S S_\alpha^\dagger(\omega)-1/2\{S_\alpha^\dagger(\omega)S_\beta(\omega),\rho_S\}) \quad (14)$$

In equation (14), the coefficients $\gamma_{\alpha,\beta}$ and $n_{\alpha\beta}$ are given by equation (15) below.

$$\gamma_{\alpha\beta}(\omega,t)+i\eta_{\alpha\beta}(\omega,t)=\int_0^\infty ds\, e^{i\omega s} tr(\tilde{B}_\alpha(t)\tilde{B}_\beta(t-s)\rho_B^{ss}) \quad (15)$$

In equation 15 $\tilde{B}_\alpha$ represents the bath operator eigenvalue a in the interaction picture and $\rho_B^{SS}$ is the equilibrium state.

A sufficient condition for the dynamics of the primary quantum system S to relax to a Gibbs state $$\frac{e^{-\beta H_S}}{tr(e^{-\beta H_S})}$$

where $\beta^{-1}$, represents a tunable temperature and $H_S$ represents the primary quantum system is given by equation (16) below.

$$\lim_{t\to\infty}[\gamma_{\alpha\beta}(-\omega,t)=e^{-\beta\omega}\gamma_{\beta\alpha}(\omega,t)] \quad (16)$$

In Equation (16) and throughout this specification, tr(•) represents the trace of the matrix or operator (•), and $\gamma_{\alpha\beta}$, $\gamma_{\beta\alpha}$ are constants as described by equation 15.

The continuum of auxiliary quantum system B bath modes should be dense enough for the limit in equation (16) to be non-periodic. Equation (16) may also be expressed by equation (17) below.

$$\frac{\gamma_{\alpha\beta}(-\omega,t)}{\gamma_{\beta\alpha}(\omega,t)} = e^{-\beta\omega} \quad (17)$$

where $\gamma_{\alpha\beta}$, $\gamma_{\beta\alpha}$, are constants as described by equation 15 and $\beta^{-1}$ represents a tunable temperature.

In addition, a sufficient condition for the dynamics of the primary quantum system S to relax to a Gibbs state $$\frac{e^{-\beta H_S}}{tr(e^{-\beta H_S})}$$

(described above) would be the Ohmic profile condition, as given by equation (18) below.

$$\gamma_{\alpha\alpha'}(\omega,t) = \delta_{\alpha\alpha'} e^{\frac{\beta}{2}\omega} f(t) \text{ for } \omega \in [\omega_{min},\omega_{max}] \quad (18)$$

In equation (18), $\gamma_{\alpha\alpha'}(-\omega, t)$ is the auxiliary quantum system response function, $\delta_{\alpha\alpha'}$ represents a Kronecker delta, $\beta^{-1}$ represents a tunable temperature, $f(t)$ represents a time-dependent real-valued function and the range of frequencies $[\omega_{min}, \omega_{max}]$ are frequencies that are relevant to the system of interest, S. In particular, the frequencies $\omega_{min}$, $\omega_{max}$ are chosen such that the interval $[\omega_{min}, \omega_{max}]$ includes the primary quantum system energy scales.

In order to achieve a tunable inverse temperature $\beta$ and implement an artificial thermal bath for the primary quantum system S the bath fluctuations must be engineered such that $\gamma_{\alpha\beta}(-\omega, t)$ satisfies condition (16) to a desired accuracy. For example, the auxiliary quantum system B may be considered as a driven dissipative quantum system where it may be ensured that the response function, or the superposition of response functions, satisfies condition (16) via controlling the time correlations of the auxiliary quantum system B.

As described above, the auxiliary quantum system B may be realized by set of resonators, qubits, or meta-material. In the following, the theory for an auxiliary quantum system of lossy resonators is presented.

For example, consider a single mode lossy resonator that is coupled to the primary quantum system S via an interaction Hamiltonian $H_I=S\otimes(a+a^\dagger)$, where a, $a^\dagger$ represent annihilation and creation operators. If the resonator is driven at frequency $\omega_d$ with strength $\epsilon$, in the frame rotating with $(-i\omega_d\, ta^\dagger a)$ where t represents time, the resonator is at a coherent steady-state $$|\alpha_{SS}\rangle = \left|\frac{\epsilon}{\Delta(=\omega_d-\omega_c)+i\kappa}\right\rangle.$$

where $\kappa$ represents resonator leakage rate and $\omega_c$ represents cavity frequency. The below analysis continues in the rotating frame with a time-dependent interaction Hamiltonian $H_I=S\otimes B(t)$, where $B(t)=e^{i\omega_d t}a+e^{i\omega_d t}a^\dagger$ and S represents the system operator.

The next step is to calculate the two-time correlation $(\tilde{B}_\alpha(t)\tilde{B}_\beta(t-s))$ in order to determine the response function γ(ω, t) at a later step, using equation (15). Using the solution of the resonator amplitude dynamics $$a(t) = \left(a - \frac{\varepsilon}{\Delta + i\kappa}\right)e^{(i\Delta - \kappa)t} + \frac{\varepsilon}{\Delta + i\kappa},$$

the two-time correlation may be given by equation (19) below.

$$\langle \tilde{B}_\alpha(t)\tilde{B}_\beta(t-s) \rangle = 2|\alpha|^2(\cos(\omega_d(2t-s) + 2\arg(\alpha)) + \cos(\omega_d s))e^{(-\omega_c + \kappa)s}(1 + |\alpha|^2) \quad (19)$$

In equation 19 $\tilde{B}_\alpha$ represents the bath operator for eigenvalue a in the interaction picture, t, s represent time, $\omega_d$ represents the resonator drive frequency, $\omega_c$ represents the cavity frequency and κ represents resonator leakage rate.

Using the equation (19) above, the response function of the auxiliary quantum system is given by equation (20) below.

$$\gamma(\omega, t) = \frac{(1 + |\alpha|^2)\kappa}{(\omega - \omega_c)^2 + \kappa^2} + \quad (20)$$

$$(e^{-i\omega_d t}\alpha^2 + |\alpha|^2)\delta(\omega - \omega_d) + (e^{i\omega_d t}(\alpha^*)^2 + |\alpha|^2)\delta(\omega + \omega_d)$$

In equation (20) α represents an eigenvalue of the system-bath interaction Hamiltonian, κ represents resonator leakage rate, ω represents frequency, $\omega_c$ represents the cavity frequency, $\omega_d$ represents the resonator drive frequency, and δ is a delta function.

In another example, if the primary quantum system is dispersively coupled to the single mode lossy resonator, that is $H_I = S \otimes a^\dagger a$ where a, $a^\dagger$ represent annihilation and creation operators and S represents the system operator, the two-time correlation function may be given by equation (21) below.

$$\langle \tilde{B}(t)\tilde{B}(t-s) \rangle = e^{(i\Delta + \kappa)s}|a|^2 \quad (21)$$

In equation 21 $\tilde{B}$ represents the bath operator in the interaction picture, t, s represent time, $\Delta = (\omega_d - \omega_c)$, $\omega_d$ represents the resonator drive frequency, $\omega_c$ represents the cavity frequency κ represents resonator leakage rate and α represents an eigenvalue of the system-bath interaction Hamiltonian.

The response function of the auxiliary quantum system is then given by equation (22) below.

$$\gamma(\omega, t) = \frac{|\alpha|^2 \kappa}{(\omega + \Delta)^2 + \kappa^2} \quad (22)$$

In equation 22 α represents an eigenvalue of the system-bath interaction Hamiltonian, κ represents resonator photon loss rate, $\Delta = (\omega_d - \omega_c)$, $\omega_d$ represents the resonator drive frequency and $\omega_c$ represents the cavity frequency.

The individual γ functions given by equations (20) and (22) may not satisfy the condition (18). Therefore, equation (18) may be approximated with a set of functions γ, as given below in equation (23).

$$e^{\frac{\beta}{2}\omega} \approx \sum_j \frac{|\alpha_j|^2 \kappa}{(\omega + \Delta_j)^2 + \kappa^2} \quad (23)$$

In equation 23, $\beta^{-1}$ represents a tunable temperature $a_1$ represents an eigenvalue of the system-bath interaction Hamiltonian, κ represents resonator photon loss rate, $\Delta = (\omega_d - \omega_c)$, $\omega_d$ represents the resonator drive frequency and $\omega_c$ represents the cavity frequency.

Figure 4:
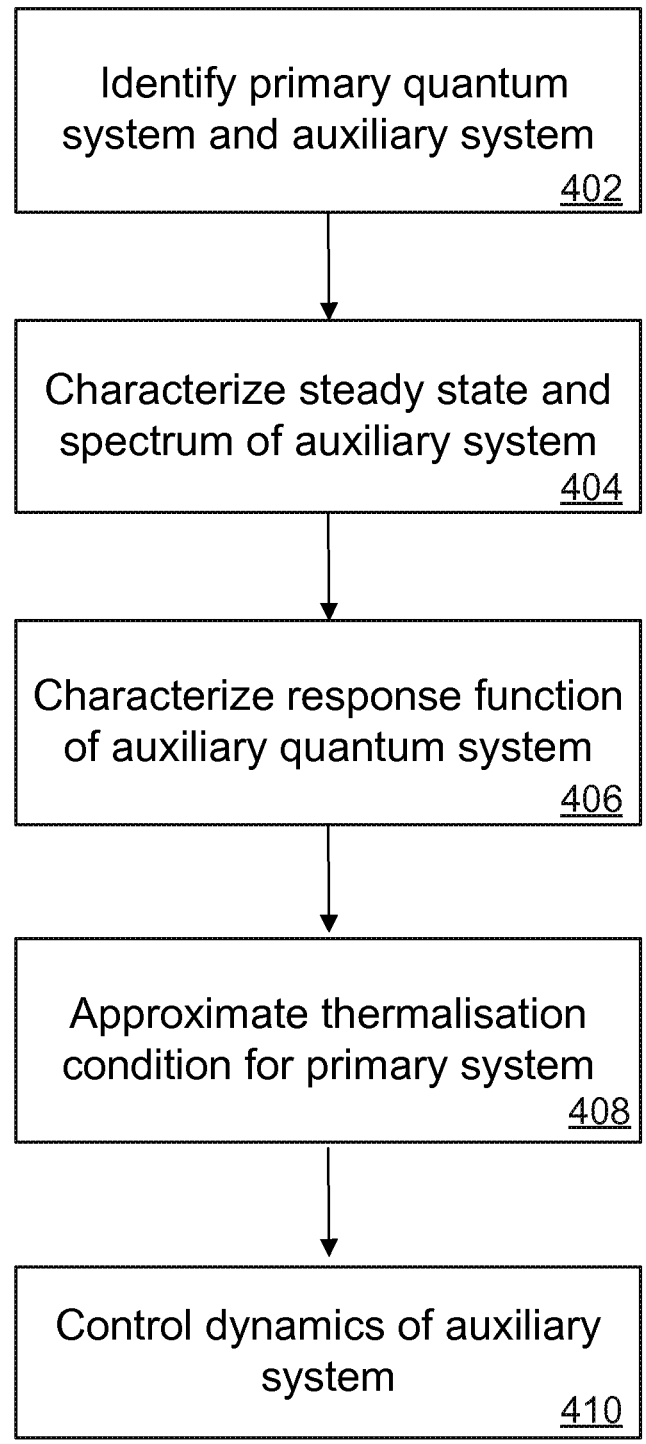
FIG. 4 is a flow diagram of an example process for designing an artificial thermal bath.

FIG. 4 is a flow diagram of an example process 400 for designing an artificial thermal bath. For example, the process 400 can be implemented using the system 100 described above with reference to FIG. 1.

The process accesses a quantum system, such as system 100 described above with reference to FIG. 1, and identifies a primary quantum system and an auxiliary quantum system (step 402). For example, the process may identify a primary quantum system such as primary quantum system 102, and an auxiliary quantum system such as auxiliary quantum system 104, described above with reference to FIG. 1. In some implementations the auxiliary quantum system may include one or more multi-mode resonators, and the primary quantum system may include one or more qubits that are either respectively coupled to a respective multi-mode resonator, or collectively coupled to a single multi-mode resonator, as described above with reference to FIGS. 2A-2C and FIGS. 3A-3B. If the one or more qubits included in the primary quantum system are superconducting qubits, the auxiliary quantum system 104 may include a set of lossy resonators, transmission lines, array of qubits, or metamaterials.

In the above review of the microscopic theory of quantum master equations and a Kubo-Martin-Schwinger (KMS) condition that guarantees the relaxation of an excited quantum system, the auxiliary quantum system is a single mode lossy resonator that is coupled to the system via a Hamiltonian $H_I = S \otimes (a + a^\dagger)$ where a, $a^\dagger$ represent annihilation and creation operators and S represents the system operator, and driven at frequency $\omega_d$ with strength ε, for example.

The process determines that the steady state and the spectrum of the auxiliary quantum system each meet a respective condition, for example the process characterizes the steady state and spectrum of the auxiliary quantum system (step 404). For example, in the above review of the microscopic theory of quantum master equations and a Kubo-Martin-Schwinger (KMS) condition that guarantees the relaxation of an excited quantum system, the steady state of the single mode lossy resonator auxiliary quantum system is a coherent steady state $$\tilde{\rho}_{SS} = |\alpha_{SS}\rangle\langle\alpha_{SS}|, |\alpha_{SS}\rangle = \left|\frac{\varepsilon}{\Delta(=\omega_d - \omega_c) + i\kappa}\right\rangle,$$

where $\omega_c$ is the cavity, i.e., resonator, frequency, $\omega_d$ represents the resonator drive frequency, κ represents resonator leakage rate, ε is the strength of the driving of the resonator and the spectrum of the single mode lossy resonator auxiliary quantum system is given by $$a(t) = \left(a - \frac{\varepsilon}{\Delta + i\kappa}\right)e^{(i\Delta - \kappa)t} + \frac{\varepsilon}{\Delta + i\kappa}.$$

The process determines that the response function of the auxiliary quantum system meets a condition, for example the process characterizes the response function of the auxiliary quantum system (step 406). For example, in the above review of the microscopic theory of quantum master equations and a Kubo-Martin-Schwinger (KMS) condition that guarantees the relaxation of an excited quantum system, the response function is characterized by first determining the two-time correlation function $\langle \tilde{\beta}_\alpha(t)\tilde{B}_\beta(t-s)\rangle$ of the single mode lossy resonator auxiliary quantum system bath operators, as given by equation (19) above. Determining the two-time correlation function enables the characterization of the response function of the auxiliary quantum system, as given by equation (20), due to the relation given by equation (15) above.

The process approximates a thermalization condition for the primary quantum system (step 408). For example, in the above review of the microscopic theory of quantum master equations and a Kubo-Martin-Schwinger (KMS) condition that guarantees the relaxation of an excited quantum system, it is described how the thermalization condition for the primary quantum system given by equation (18) above may be approximated using a set of response functions γ that are summed in order to create a superposition of response functions.

The process controls the dynamics of the auxiliary quantum system in order to achieve an effective temperature for the primary quantum system (step 410). For example, the height, peak center and width of a Lorentzian function may be controlled by the amplitude of the drive signal E, leakage rate κ and drive frequency $\omega_d$ accordingly. In some implementations the leakage rate may be frequency dependent. The frequency range of the designed artificial quantum thermal bath corresponds to effective energy scales in the primary quantum system, and the strength of the coupling between the designed artificial thermal bath and the primary quantum system corresponds to a thermalization speed. In some implementations, the designed artificial thermal bath may enable an analog realization of quantum metropolis sampling. In other implementations, the designed artificial thermal bath may serve as a thermal drive for a hybrid quantum-classical annealer.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus, comprising:
a primary quantum system;
an auxiliary quantum system forming an artificial thermal quantum bath for the primary quantum system and comprising one or more resonators operating in a plurality of auxiliary quantum system modes, wherein the auxiliary quantum system interacts with the primary quantum system, wherein:
the auxiliary quantum system interacts with the primary quantum system through one or more couplings, wherein the one or more couplings are controllable;
a steady state of the auxiliary quantum system, a response function of the auxiliary quantum system, an auxiliary quantum system operator, and a frequency spectrum of the auxiliary quantum system are characterized as functions of tunable physical parameters of the auxiliary quantum system; and the auxiliary quantum system is controllable to relax the primary quantum system to an equilibrium state using a controllable function of the auxiliary quantum system operator.

2. The apparatus of claim 1, wherein the auxiliary quantum system interacts with an environment external to the primary quantum system and the auxiliary quantum system.

3. The apparatus of claim 1, wherein dynamics of the auxiliary quantum system are controllable to relax the primary quantum system to the equilibrium state using the controllable function of the auxiliary quantum system operator.

4. The apparatus of claim 3, wherein the dynamics of the auxiliary quantum system are controlled such that the auxiliary quantum system is an artificial thermal quantum bath for the primary quantum system.

5. The apparatus of claim 4, wherein the equilibrium state of the primary quantum system is described by a Gibbs state $e^{-\beta H_s}/Z$ where $\beta^{-1}$ represents a tunable temperature of the primary quantum system, $H_S$ represents the primary quantum system Hamiltonian and Z represents a partition function which plays role of a normalizing constant.

6. The apparatus of claim 1, wherein the controllable function of the auxiliary quantum system operator is a two-time correlation function of the auxiliary quantum system operator.

7. The apparatus of claim 1, wherein the auxiliary quantum system comprises one or more multi-mode resonators, the plurality of auxiliary quantum system modes comprise resonator modes, and the spectrum of the auxiliary quantum system is a function of a set of the tunable physical parameters of the auxiliary quantum system, the tunable physical parameters comprising (i) a frequency and amplitude of a drive signal used to drive the one or more multi-mode resonators, and (ii) a leakage rate of the resonator modes.

8. The apparatus of claim 7, wherein the set of tunable physical parameters are tuned using a controllable two-time correlation function.

9. The apparatus of claim 1, wherein dynamics of the auxiliary quantum system are controlled such that $$\lim_{t \to \infty} [\gamma_{\alpha\beta}(-\omega, t) = e^{-\beta\omega}\gamma_{\beta\alpha}(\omega, t)]$$

is satisfied within a first accuracy, where t represents time, $\gamma_{\alpha\beta}(-\omega, t)$ represents the response function of the auxiliary quantum system with $\alpha,\beta$ representing eigenvalues of a primary quantum system—thermal quantum bath tunable Hamiltonian, $\omega$ represents auxiliary quantum system frequency and $\beta^{-1}$ represents a tunable temperature of the primary quantum system.

10. The apparatus of claim 1, wherein dynamics of the auxiliary quantum system are controlled such that $$\gamma_{\alpha\alpha'}(\omega, t) = \delta_{\alpha\alpha'} e^{\frac{\beta}{2}\omega} f(t) \text{ for } \omega \in [\omega_{min}, \omega_{max}]$$

is satisfied within a second accuracy, where $\gamma_{\alpha\alpha'}(\omega, t)$ represents the response function of the auxiliary quantum system with $\alpha, \alpha'$ representing eigenvalues of a primary quantum system—thermal quantum bath interaction Hamiltonian, $\delta_{\alpha\alpha'}$ represents a Kronecker delta of the eigenvalues, $\beta^{-1}$ represents a tunable temperature of the primary quantum system, $\omega$ represents auxiliary quantum system frequency, $f(t)$ represents a time-dependent real-valued function that provides a time dependent modulation of frequency characteristic of the response function of the auxiliary quantum system and $\omega_{min}$, $\omega_{max}$ represent minimum and maximum frequency values of the auxiliary quantum system.

11. The apparatus of claim 10, wherein dynamics of the auxiliary quantum system are controlled such that $$\gamma_{\alpha\alpha'}(\omega, t) = \delta_{\alpha\alpha'} e^{\frac{\beta}{2}\omega} f(t) \text{ for } \omega \in [\omega_{min}, \omega_{max}]$$

is satisfied within the second accuracy according to a set of values of response functions $\gamma_{\alpha\alpha'}(\omega, t)$, where $\gamma_{\alpha\alpha'}(\omega, t)$ represents the response function of the auxiliary quantum system with $\alpha, \alpha'$ representing eigenvalues of a primary quantum system—thermal quantum bath interaction Hamiltonian, $\delta_{\alpha\alpha'}$ represents a Kronecker delta of the eigenvalues, $\beta^{-1}$ represents a tunable temperature of the primary quantum system, $\omega$ represents auxiliary quantum system frequency, $f(t)$ represents a time-dependent real-valued function that provides a time dependent modulation of frequency characteristic of the response function of the auxiliary quantum system and $\omega_{min}$, $\omega_{max}$ represent minimum and maximum frequency values of the auxiliary quantum system.

12. The apparatus of claim 11, wherein the minimum and maximum frequency values $\omega_{min}$ and $\omega_{max}$ are chosen such that energy scales of the primary quantum system correspond to auxiliary system frequencies that are included in the interval $[\omega_{min}, \omega_{max}]$.

13. The apparatus of claim 1, wherein the auxiliary quantum system enables an analog realization of Quantum Metropolis Sampling.

14. The apparatus of claim 1, wherein the auxiliary quantum system serves as a thermal drive for a hybrid quantum-classical annealer.

15. The apparatus of claim 1, wherein the auxiliary quantum system comprises one or more multi-mode resonators.

16. The apparatus of claim 15, wherein the primary quantum system comprises one or more qubits that are respectively coupled to a respective multi-mode resonator.

17. The apparatus of claim 15, wherein the primary quantum system comprises one or more qubits that are collectively coupled to a multi-mode resonator.

18. A method, comprising:
identifying a primary quantum system;
identifying an auxiliary quantum system as a quantum bath, the auxiliary quantum system comprising one or more resonators operating in a plurality of auxiliary quantum system modes, wherein the auxiliary quantum system interacts with the primary quantum system;
determining that a steady state, response function and frequency spectrum of the auxiliary quantum system are each characterized as functions of tunable physical parameters of the auxiliary quantum system meet a respective condition;
approximating a thermalization condition for the primary quantum system using the response function and the spectrum of the auxiliary quantum system; and
controlling the auxiliary quantum system based on the approximated thermalization condition to achieve a range of tunable effective temperatures for the primary quantum system.

19. The method of claim 18, wherein the auxiliary quantum system interacts with an environment external to the primary quantum system and the auxiliary quantum system.

20. The method of claim 18, wherein controlling the auxiliary quantum system comprises controlling dynamics of the auxiliary quantum system.

21. The method of claim 20, wherein controlling the dynamics of the auxiliary quantum system based on the approximated thermalization condition comprises tuning a set of physical parameters comprising (i) an auxiliary quantum system frequency, (ii) an auxiliary quantum system density of modes, (iii) a frequency and amplitude of a drive signal, and (iv) a leakage rate of resonator modes, and tuning a strength of a coupling between the primary quantum system and the auxiliary quantum system.

22. The method of claim 21, wherein the set of physical parameters and the auxiliary quantum system modes are tuned in order to achieve a controllable two-time correlation function.

23. The method of claim 21, wherein the auxiliary quantum system frequency is a member of a frequency range that corresponds to an effective energy scale of the primary quantum system.

24. The method of claim 21, wherein the strength of the coupling between the primary quantum system and the auxiliary quantum system corresponds to a thermalization speed.

25. The method of claim 18, further comprising using the auxiliary quantum system as an artificial thermal quantum bath for the primary quantum system.

* * * * *

UNITED STATES PATENT AND TRADEMARK OFFICE
CERTIFICATE OF CORRECTION

| | |
|---|---|
| PATENT NO. | : 11,222,149 B2 |
| APPLICATION NO. | : 15/771109 |
| DATED | : January 11, 2022 |
| INVENTOR(S) | : Barzegar et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 695 days.

Signed and Sealed this
Fifteenth Day of November, 2022

Katherine Kelly Vidal
*Director of the United States Patent and Trademark Office*